United States Patent [19]

Ishii et al.

[11] Patent Number: 5,323,209
[45] Date of Patent: Jun. 21, 1994

[54] APPARATUS FOR PRECISION ALIGNMENT OF PLATES USED IN TWO-SIDED CONTACT PRINTING

[75] Inventors: Fusao Ishii, Pittsburgh; Joseph A. Marcanio, Greensburg; David S. Reuss, Herminie, all of Pa.

[73] Assignee: Sony Electronics Inc., Park Ridge, N.J.

[21] Appl. No.: 54,279

[22] Filed: Apr. 30, 1993

[51] Int. Cl.⁵ .............................................. G03B 27/04
[52] U.S. Cl. ....................................................... 355/89
[58] Field of Search ........................ 355/79, 85, 89, 99

[56] References Cited

U.S. PATENT DOCUMENTS

| | | | |
|---|---|---|---|
| 2,720,146 | 10/1955 | Mears | 355/89 |
| 3,199,430 | 8/1965 | Brown | 355/91 |
| 3,313,225 | 4/1967 | Mears | 355/89 |
| 3,751,250 | 8/1973 | Moscony et al. | 355/91 X |
| 4,084,870 | 4/1978 | Laserson et al. | 339/18 P |
| 4,391,479 | 7/1983 | Wessel | 339/18 C |
| 4,588,676 | 5/1986 | Moscony et al. | 430/327 |
| 4,666,294 | 5/1987 | Gelbert et al. | 355/89 |
| 4,669,871 | 6/1987 | Wetzel et al. | 355/91 |
| 5,258,808 | 11/1993 | Watanuki | 355/89 |

*Primary Examiner*—Richard A. Wintercorn
*Attorney, Agent, or Firm*—Ronald P. Kananen

[57] ABSTRACT

An alignment system for aligning the print plates of a two-sided contact printing station includes expanding pin assemblies each having an expanding collet and a mandrel for engaging and aligning match drilled holes in each of the print plates. An expansion cylinder moves the mandrel into and out of engagement with the expanding collet to cause the collet to expand into engagement with the match drilled holes. The outside profile of the expanding collet forms a straight-pin diameter which corresponds to the diameter of the match drilled holes when expanded. The expanding pin assemblies may be contracted to facilitate moving the print plates apart for advancing the working material.

18 Claims, 6 Drawing Sheets

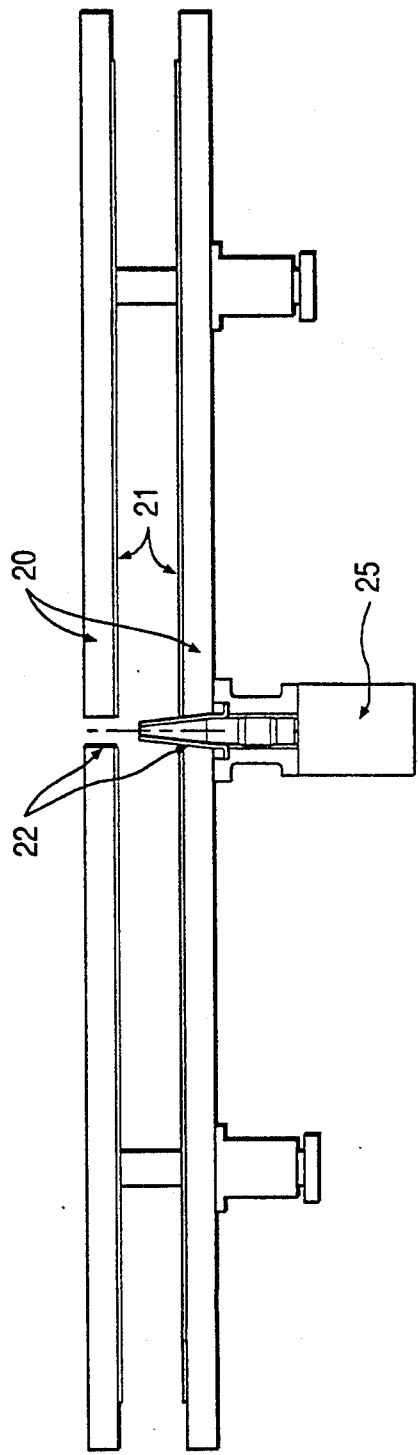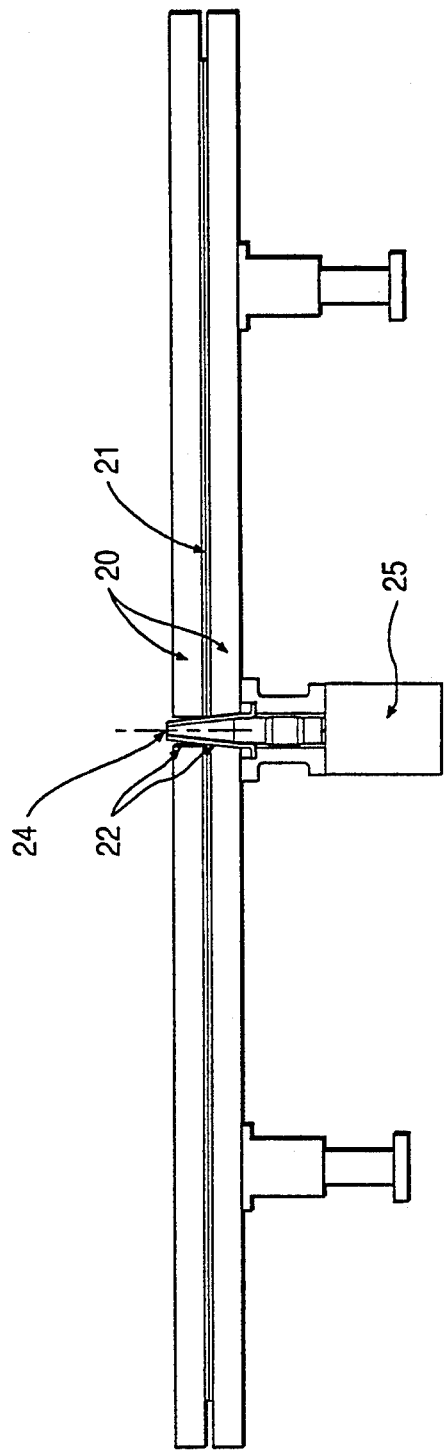

APPARATUS FOR PRECISION ALIGNMENT OF PLATES USED IN TWO-SIDED CONTACT PRINTING

BACKGROUND OF THE INVENTION

1. Field of the Invention

The present invention relates generally to an apparatus to be used in a two-sided contact printing station and particularly as directed to improvements for obtaining a high precision alignment between two plates on opposite sides of a material to be printed.

2. Description of Prior Art

In the present systems for two-sided contact printing, a typical arrangement includes a thin sheet of light-sensitized working material inserted between a pair of photographic plates attached to suitable frames. The photographic plates each contain a pattern which is projected onto a respective light-sensitized surface of the working material using well known photographic techniques.

Some difficulties have been encountered with the plate mountings used heretofore. There has been a tendency for the frames to shift during normal use so that frequent adjustment has been required to maintain precise registration of the plates with respect to each other. Therefore, in addition to the pattern to be photographically reproduced on the working material, the plates typically carry an alignment system to insure precise registration of the projected patterns. The alignment system may take the form of imprinted registration blocks or indices on each of the plates which must be aligned with one another. For example, U.S. Pat. No. 3,199,430 describes an alignment system where a visual indication of alignment is provided by registration blocks on the plates, and a plurality of adjusting levers are provided to manipulate the plates into position. This lever adjustment has proven too tedious and time consuming for use in a high production environment and has typically been replaced by very complex and costly automated electro-mechanical controls to provide consistent results.

FIGS. 2 and 3 illustrate another known alignment system which includes attaching a number of fixed profile alignment pins 20 or 20' to one of the plates 15, and providing matching female sockets or bushings 21 or 21' in the other plate 16. The system of FIG. 2 utilizes a tapered pin 20 and a corresponding tapered socket or bushing 21. The system of FIG. 3 utilizes a straight diameter pin 20' and a corresponding straight diameter socket or bushing 21'. While providing a low-cost alternative to the automated visual systems, the fixed profile alignment pin systems often suffer from an inherently low precision caused by worn out contact surfaces after prolonged use. Even a small degree of wear is unacceptable in many applications, such as the manufacture of CRT aperture masks and grills, where a precision range of +/−0.0002 inches may be required.

SUMMARY OF THE INVENTION

It is an object of the present invention to provide an improved two-sided contact printing station which produces consistent and accurate printed material over long periods of heavy duty use.

It is a further object of the present invention to provide a high precision, yet low-cost, alignment system for aligning the plates used in a two-sided contact printing station.

It is a further object of the present invention to provide an alignment system for aligning the plates used in a two-sided contact printing station which allows for easy maintenance and replacement of the printing plates.

It is a further object of the present invention to provide an improved alignment system for easily aligning the plates used in a two-sided contact printing station after allowing sufficient movement between the plates to allow insertion and withdrawal of the material to be printed.

It is a further object of the present invention to provide an improved alignment system that is self-aligning during use.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects and in accordance with the purpose of the present invention, as embodied and broadly described herein, the apparatus of this invention may comprise a precision alignment system for a two-sided contact printing station, including a first print plate assembly having at least one alignment hole formed therein and a first print plate, the first print plate having a pattern for printing formed thereon; a second print plate assembly having at least one alignment hole formed therein and a second print plate, the second print plate having a pattern for printing formed thereon; and an alignment means for aligning the patterns on the first and second plates with respect to each other, the alignment means including an expanding pin assembly received in the alignment holes of the first and second plate assemblies for aligning the holes with respect to each other.

In a further aspect of the present invention, in accordance with its objects and purposes, the apparatus of this invention may further comprise, the expanding pin assembly including a mandrel and an expanding collet, the mandrel having an external profile, the expanding collet having an internal profile and an external profile, the external profile of the mandrel engaging the internal profile of the expanding collet and causing the external profile of the expanding collet to engage the alignment holes when the plate assemblies are aligned, the external profile of the mandrel being tapered, the internal profile of the expanding collet being tapered, the external profile of the expanding collet forming a straight-pin diameter when expanded into an aligning position, and an expansion cylinder operatively connected to the mandrel for moving the mandrel into and out of engagement with the expanding collet.

BRIEF DESCRIPTION OF THE DRAWINGS

The accompanying drawings, which are incorporated in, and form a part of, the specification, illustrate an embodiment of the present invention and, together with the description, serve to explain the principles of the invention. In the drawings:

FIG. 6 is a cross-section view of a printing station having a precision alignment system according to the present invention with the print frames in extended position.

FIG. 7 is a cross-section view of the printing station shown in FIG. 6 with the print frames in working position.

DETAILED DESCRIPTION OF THE PREFERRED EMBODIMENT

Reference will now be made in detail to the preferred embodiment of the invention, an example of which is illustrated in the accompanying drawings.

Figure 1:
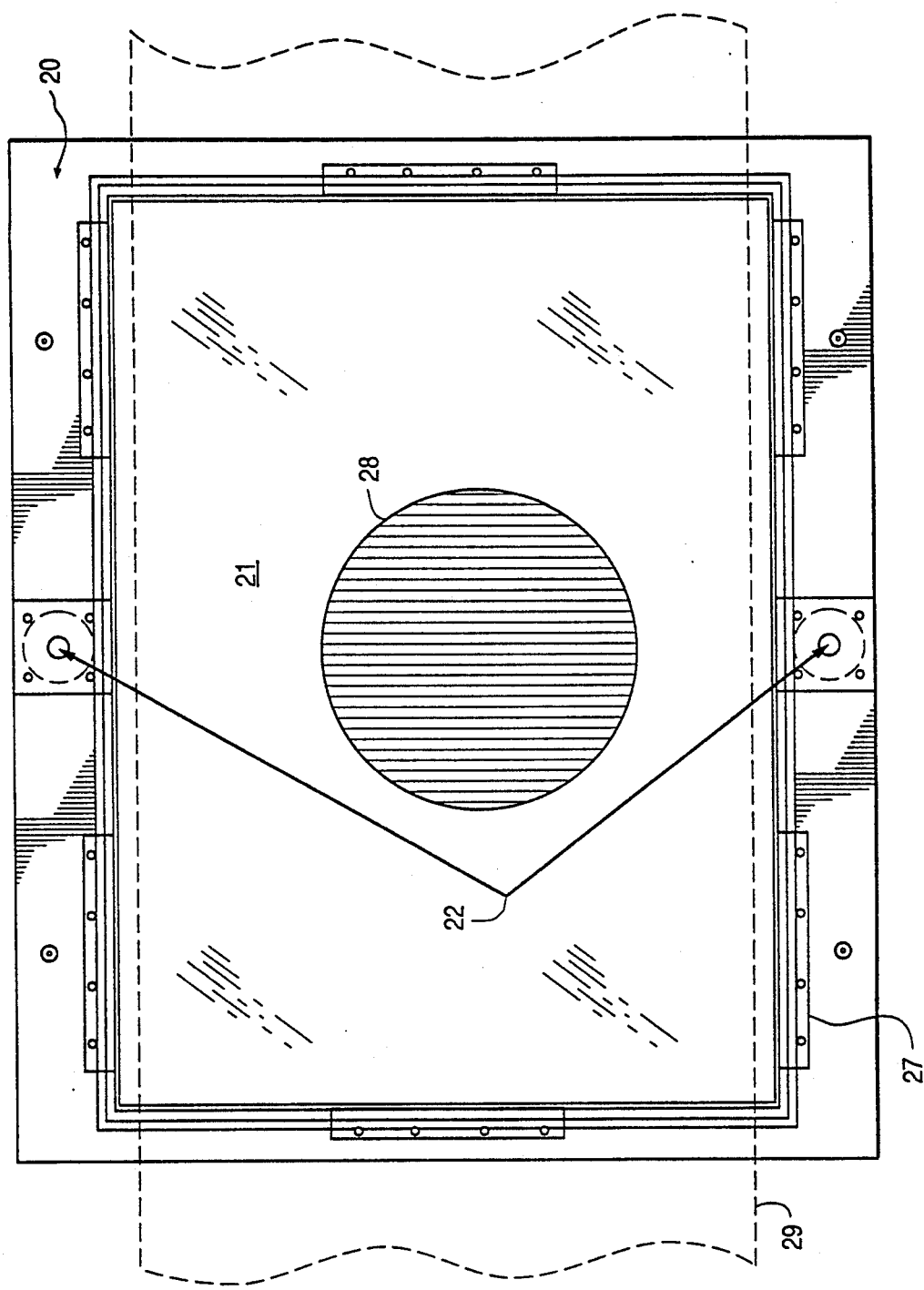
FIG. 1 is a plan view of a printing station according to the present invention showing locations of the alignment pins.
Figure 2:
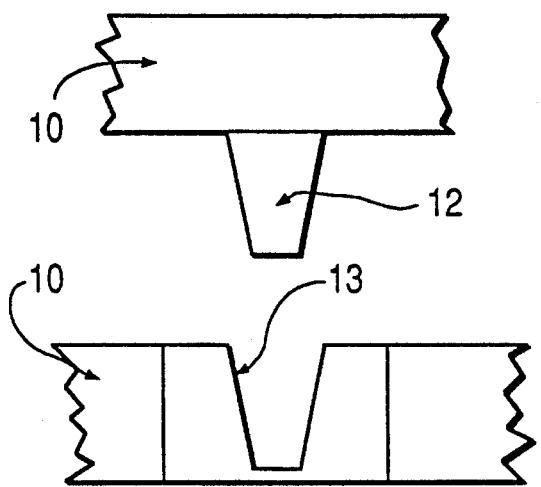
FIG. 2 is a diagrammatic view of a prior art tapered fixed pin alignment system.
Figure 3:
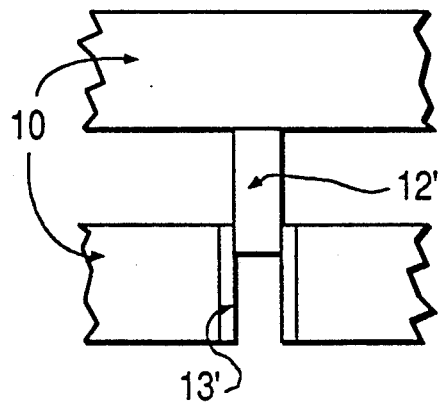
FIG. 3 is a diagrammatic view of a prior art straight fixed pin alignment system.

A two-sided contact printing station utilizing the alignment system of the present invention is shown in plan view in FIG. 1. The printing station is typically one of a series of stations required to produce CRT aperture grills and masks, photo-etched circuit boards, and other products made by photo-etching from both sides of a photosensitized working material 29. Stations for preparing the photosensitized material 29 before and after the printing process are well known in the art and will not be further described since they form no part of the present invention.

The printing station of FIG. 1 includes upper and lower print frames 20 each defining a rectangular opening for receiving a glass plate 21. Fixing means 27 are provided for suitably fixing the glass plates 21 to the print frames 20, for example, by adhesive, vacuum, or clamps, or a combination thereof. The print frames 20 and glass plates 21 are shown as being substantially rectangular in shape, but it is recognized that other suitable shapes may be used without departing from the present invention.

The glass plates 21, which are sometimes referred to as production plates or production positives, contain images of patterns to be photoprinted, as indicated by shaded area 28. The patterns 28 on each of the glass plates 21 are formed on the plates in registry with one another, such that the pattern on each plate 21 corresponds exactly with the pattern on the other plate 21 and can be perfectly aligned therewith. In this manner, a precision product having perfectly matched sides may be photo-printed, as long as the plates 21 are kept aligned with one another during the printing process. Matching holes 22 for receiving expanding alignment pins are match-drilled through the top and bottom print frames 20 when the two plates 21 and their respective patterns 28 are in registry with one another.

Figure 4:
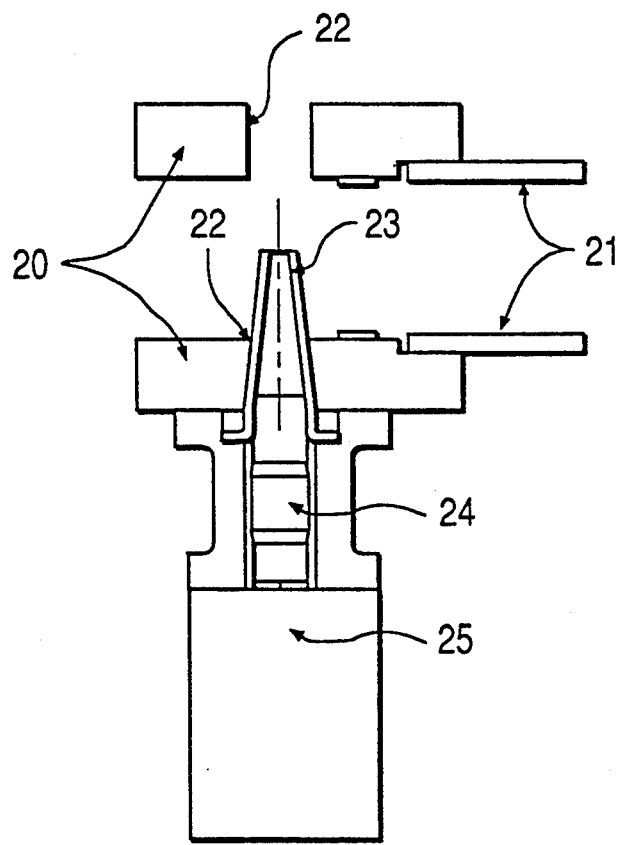
FIG. 4 is a cross-section detail of a precision alignment system according to the present invention with the print frames in extended position.
Figure 5:
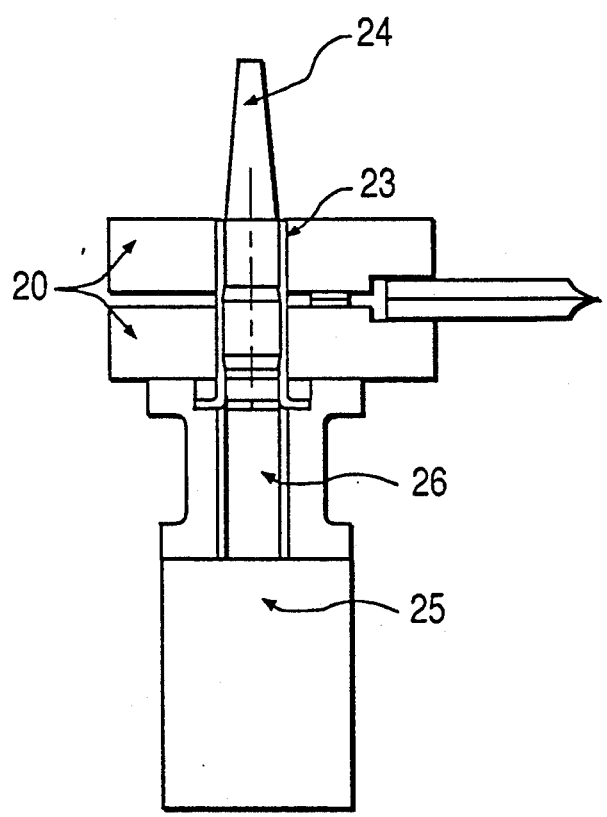
FIG. 5 is a cross-section detail of the system shown in FIG. 4 with the print frames in working position.

The invention uses an expanding alignment pin assembly to align the two glass plates during the printing process. The alignment pin assembly includes a collet 23, and a mandrel 24 concentrically positioned therein for expanding the collet 23 (see FIGS. 4 and 5). In a preferred embodiment, the external profile of the mandrel 24 includes a series of tapered, conical-shaped engaging surfaces for engaging corresponding tapered surfaces of the inner profile of the collet 23. It is contemplated that other suitable shapes of the mandrel (e.g., cylindrical) may be used. The mandrel 24 is supported by an expansion cylinder 25 for linear movement into the collet 23.

Figure 8A:
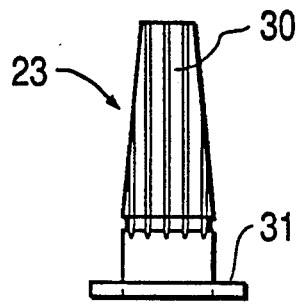
FIGS. 8a-8c are front, plan, and cross-section views, respectively, of an expanding collet of the alignment system according to the present invention.
Figure 8B:
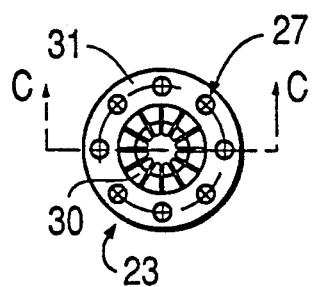
Figure 8C:
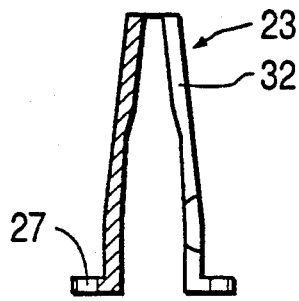
Figure 9B:
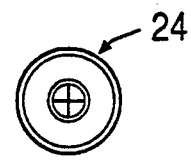
FIGS. 9a and 9b are front and plan views, respectively, of a mandrel of the alignment system according to the present invention.
Figure 9A:
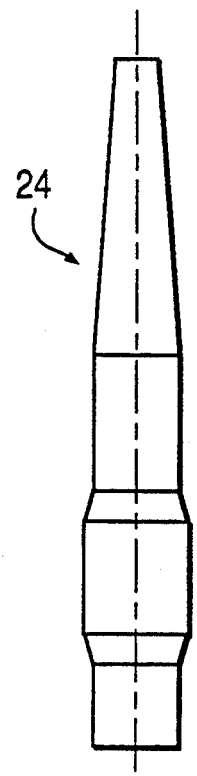

The collet 23 includes a collar 31 (FIGS. 8a and 8b) having a plurality of circumferentially spaced apertures 27 for fixing the collet 23 to the lower side of the bottom print frame 20. A plurality of circumferentially spaced o radial cuts 30 are formed in the upper portion of the collet 23 to enable the collet to be easily expanded during operation. The internal profile of the collet 23 is designed to match the external profile of the mandrel 24. The outside profile 36 of the collet 23 is designed to develop a certain "straight pin" diameter when the mandrel 24 is at full stroke. This "straight pin" diameter corresponds to the diameter of the matching holes 22 in the print frames.

Although the collet 23 is connected to the bottom print frame 20, it is attached in a manner to allow it to find the center of the matching hole on the bottom frame 20 as the collet 23 is expanded. The attachment may, for example, take the form of shoulder bolts which, when tightened, allow the collet 23 to move slightly in a direction parallel to the lower surface of the bottom print frame. The collet 23 may be attached directly to the print frame, or may be attached to a mounting bracket portion of the expansion cylinder 25. Similarly, the mandrel 24 is supported by the expansion cylinder 25 in a manner to allow the mandrel to float with respect to the bottom frame to allow the mandrel to find the center of the collet 23 when extended. The top frame 20 is also allowed to float with respect to the bottom frame 20 so that alignment of the plates 21 is achieved solely by the expanding alignment pins without any outside forces hindering the process.

In the practice of this invention, after the frames 20 have been mounted to one another with the opposing plates 21 positioned on each side of a photosensitized working material (FIG. 6), the plates 21 may be precisely aligned with respect to each other using the expanding pin assembly. As shown in FIG. 7, the printed plates 21 are moved into engagement with opposite sides of the working material (not shown) in preparation for the photoprinting process. The cylinder 25 then extends the mandrel 24 into the collet 23 to cause the collet 23 to expand into a "straight-pin" profile for aligning the plates. Once the collet 2 is expanded and the plates 21 are perfectly aligned, the plates 21 are then drawn firmly down upon the working material so that the plates make close contact therewith to ensure that accurately defined patterns are projected upon the working material. Preferably, vacuum is applied in a known manner to the photoprinting apparatus to assist in drawing the plates 21 into firm contact with the material 29.

After the photoprinting process has occurred (approximately one minute), the print plates 21 are again moved apart, and the working material is advanced through the printing station to position a new portion of the material to be printed between the plates 21. The alignment pin assembly may be contracted to facilitate the moving of the print plates 21 and respective frames 20 apart and back again for advancing the working material 29. Contracting the pin assembly will prevent excessive wear of the collet 23 while maintaining a rough alignment between the two plates 21.

In a preferred embodiment, the plates 21 move apart a distance of approximately four inches during advancement of the working material. Of course, alignment of the plates 21 when they are separated from the working material is not important so the pin assembly may remain contracted during this time. The plates will preferably move to approximately 0.030 inch of the working material before the pin assembly is expanded, and can then be drawn down upon the working material in precise alignment with each other. In this manner, damage to the working material is minimized because the plates are in alignment before they contact the surfaces of the working material. By this technique, precise alignment is not needed until the final draw down of the plates on the working material.

Despite the relative simplicity in comparison to other alignment systems utilized in the past, the expanding pin assembly of the present invention achieves a much higher degree of precise alignment of the plates 21 (i.e., within $+/-0.0002$ inches of exact alignment).

Since the collet 23 and mandrel 24 are concentric with respect to the centerline of one another, the expansion of the collet 23 will be equal in all radial directions. The collet 23 can also compensate for any wear on the circumference of the respective matching hole 22 in the frame 20. The collet 23 will automatically increase at an equal rate radially outward to compensate for wear simply by keeping the tapered surfaces of the mandrel 24 firmly pushed against the inner profile of the collet. This allows the expanding pin to be "self-centering" and assures alignment precision to be maintained even after wear produced through heavy use.

The foregoing description of a preferred embodiment of the invention has been presented for purposes of illustration and description. It is not intended to be exhaustive or to limit the invention to the precise form disclosed, and obviously many modifications and variations are possible in light of the above teaching. For example, the expanding pin assembly may contact the glass printing plates rather than the frame holding the printing plates. Also, the alignment mechanism could be applied to other processes requiring high precision, such as a screening process. Furthermore, while the alignment system has been disclosed using two expansion pin assemblies on the perimeter of the print frame, fewer or more pin assemblies may be provided as desired.

The preferred embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A precision alignment system for a two-sided contact printing station, comprising:
    a first print plate assembly having at least one alignment hole formed therein and a first print plate, said first print plate having a pattern for printing formed thereon;
    a second print plate assembly having at least one alignment hole formed therein and a second print plate, said second print plate having a pattern for printing formed thereon; and
    an alignment means for aligning the patterns on said first and second plates with respect to each other, said alignment means including an expanding pin assembly comprising a mandrel and an expanding collet received in said alignment holes of said first and second plate assemblies for aligning said holes with respect to each other.

2. A precision alignment system as defined in claim 1, wherein a second set of alignment holes are formed in said first and second print plate assemblies, and said alignment means including a second expanding pin assembly comprising a mandrel and an expanding collet for aligning said second set of holes with respect to each other.

3. A precision alignment system as defined in claim 2, wherein said alignment means further includes at least one expansion cylinder operatively connected to said mandrels of the first and second expanding pin assemblies for linearly moving said mandrels into engagement with a respective expanding collet.

4. A precision alignment system as defined in claim 3, wherein said first and second expanding pin assemblies are mounted to said first print plate assembly in such a manner to allow self-alignment of said pin assemblies with respective alignment holes in each of the first and second plate assemblies.

5. A precision alignment system as defined in claim 4, wherein each of said mandrels has a tapered, conical-shaped outer profile.

6. A precision alignment system as defined in claim 5, wherein each of said expanding collets has a tapered inner profile corresponding to the outer profiles of said mandrels.

7. A precision alignment system as defined in claim 6, wherein each of said expanding collets forms a straight-pin outer profile within said alignment holes when said plate assemblies are aligned.

8. A precision alignment system as defined in claim 7, wherein said first and second plate assemblies each include a print frame, said print frames having said alignment holes formed therein, and means for fixing said print plates to said print frames.

9. A precision alignment system as defined in claim 8, wherein each of said expanding collets includes a series of radial cuts to enable the collet to be easily expanded.

10. A precision alignment system as defined in claim 9, wherein each of said expanding collets further includes a collar having holes formed therein for mounting to a respective plate assembly.

11. A precision alignment system for a two-sided contact printing station, comprising:
    a first print plate assembly having at least one alignment hole formed therein and a first print plate, said first print plate having a pattern for printing formed thereon;
    a second print plate assembly having at least one alignment hole formed therein and a second print plate, said second print plate having a pattern for printing formed thereon; and
    an alignment means for aligning the patterns on said first and second plates with respect to each other, said alignment means including pin assembly for inserting in said alignment holes of said first and second plate assemblies for aligning said holes with respect to each other, said pin assembly having means for selectively expanding a diameter thereof while received in said alignment holes.

12. A precision alignment system as defined in claim 11, wherein said expanding means of said pin assembly comprises a mandrel and an expanding collet, said mandrel having an external profile, and said expanding collet having an internal profile and an external profile, said external profile of said mandrel engaging said internal profile of said expanding collet and causing said external profile of said expanding collet to engage said alignment holes for aligning said plate assemblies.

13. A precision alignment system as defined in claim 12, wherein said external profile of said mandrel is tapered, said internal profile of said expanding collet is tapered, and said external profile of said expanding collet forms a straight-pin diameter when expanded into an aligning position.

14. A precision alignment system as defined in claim 13, further comprising an expansion cylinder operatively connected to said mandrel for moving said mandrel into and out of engagement with said expanding collet.

15. A precision alignment system for a two-sided contact printing station, comprising:
   a first print plate assembly having first and second alignment holes formed therein and a first print plate, said first print plate having a pattern for printing formed thereon;
   a second print plate assembly having first and second alignment holes formed therein and a second print plate, said second print plate having a pattern for printing formed thereon; and
   an alignment means for aligning the patterns on said first and second plates with respect to each other, said alignment means including first and second pin assemblies for inserting in said first and second alignment holes of said first and second plate assemblies, respectively, for aligning said holes with respect to each other said first and second pin assemblies each having means for selectively expanding a diameter thereof while received in said alignment holes.

16. A precision alignment system as defined in claim 15, wherein said expanding means of said first and second pin assemblies each comprises a mandrel and an expanding collet, said mandrel having an external profile, and said expanding collet having an internal profile and an external profile, said external profile of said mandrel engaging said internal profile of said expanding collet and causing said external profile of said expanding collet to engage said alignment holes for aligning said plate assemblies.

17. A precision alignment system as defined in claim 16, wherein said external profile of said mandrel is tapered, said internal profile of said expanding collet is tapered, and said external profile of said expanding collet forms a straight-pin diameter when expanded into an aligning position.

18. A precision alignment system as defined in claim 17, further comprising an expansion cylinder operatively connected to said mandrel for moving said mandrel into and out of engagement with said expanding collet.

* * * * *